(12) United States Patent  
Kousai (10) Patent No.: US 8,742,844 B2  
(45) Date of Patent: Jun. 3, 2014

(54) POWER AMPLIFIER DEVICE

(75) Inventor: Shouhei Kousai, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/604,370

(22) Filed: Sep. 5, 2012

(65) Prior Publication Data

US 2013/0214867 A1 Aug. 22, 2013

(30) Foreign Application Priority Data

Feb. 17, 2012 (JP) ................................ P2012-032749

(51) Int. Cl.
*H03G 3/20* (2006.01)

(52) U.S. Cl.
USPC ........................ 330/136; 330/279; 330/129

(58) Field of Classification Search
USPC ........................................ 330/136, 279, 129
See application file for complete search history.

(56) References Cited

U.S. PATENT DOCUMENTS

| | | | |
|---|---|---|---|
| 3,740,670 A * | 6/1973 | Hoffman | 332/162 |
| 4,591,800 A * | 5/1986 | Opas | 330/86 |
| 5,193,224 A * | 3/1993 | McNicol et al. | 455/126 |
| 5,886,572 A | 3/1999 | Myers et al. | |
| 6,930,549 B2 * | 8/2005 | Kajiwara et al. | 330/254 |
| 7,358,807 B2 | 4/2008 | Scuderi et al. | |
| 7,486,137 B2 | 2/2009 | Magoon et al. | |
| 7,502,601 B2 | 3/2009 | Dupuis | |
| 7,519,337 B2 * | 4/2009 | Ito et al. | 455/127.3 |
| 7,768,346 B1 * | 8/2010 | Terrovitis | 330/136 |
| 7,894,772 B2 * | 2/2011 | Aoki | 455/63.1 |
| 8,385,875 B2 * | 2/2013 | Yoshizaki et al. | 455/333 |
| 2008/0218269 A1 | 9/2008 | Kirisawa | |
| 2011/0235689 A1 | 9/2011 | Kousai | |

FOREIGN PATENT DOCUMENTS

JP 2001-036351 2/2001

OTHER PUBLICATIONS

Hang Song et al., A CMOS Adaptive Antenna-Impedance-Tuning IC Operating in the 850MHz-to-2GHz Band, ISSCC 2009/Session 22/PA and Antenna Interface/22.6., 2009 IEEE International Solid-State Circuits Conference, 4 pages, Arizona State University, Tempe, AZ.

Bezooijen et al., "A GSM/EDGE/WCDMA Adaptive Series-LC Matching Network Using RF-MEMS Switches", IEEE Journal of Solid-State Circuits, vol. 43, No. 10, Oct. 2008, pp. 2259-2268.

* cited by examiner

*Primary Examiner* — Patricia Nguyen (74) *Attorney, Agent, or Firm* — Patterson + Sheridan LLP (57) ABSTRACT

A power amplifier device includes an input terminal for a RF input signal. The power amplifier device includes an output terminal a RF output signal. The power amplifier device includes a first power amplifier connected to the input terminal, amplifies the RF input signal with a first gain, and outputs a first amplified signal. The power amplifier device includes a second power amplifier that amplifies a signal on the basis of the first amplified signal and outputs a second amplified signal with a second gain. The power amplifier device includes a low-pass filter or a band-pass filter that filters the second amplified signal. The power amplifier device includes an amplitude comparator to compare the first amplitude of the first comparison signal generated from the RF input signal with the second amplitude of the second comparison signal generated from the filtered signal and to output an amplitude comparison signal.

9 Claims, 6 Drawing Sheets

POWER AMPLIFIER DEVICE

CROSS-REFERENCE TO RELATED APPLICATION

This application is based upon and claims the benefit of priority from Japanese Patent Application No. 2012-032749, filed Feb. 17, 2012; the entire contents of which are incorporated herein by reference.

FIELD

Embodiments described herein relate to a power amplifier device.

BACKGROUND

The prior art teaches a power amplifier device that amplifies and outputs an input RF signal.

DETAILED DESCRIPTION

Embodiments disclosed herein provide a power amplifier device that can reduce distortion in an RF output signal.

The power amplifier device, according to an embodiment, has an input terminal for input of an RF input signal. The power amplifier device has an output terminal for output of an RF output signal. The power amplifier device has a first power amplifier that has its input connected to the input terminal, amplifies the amplitude of the RF input signal with a first gain, and outputs a first amplified signal. The power amplifier device has a second power amplifier that has its output connected to the output terminal, amplifies a signal based on the first amplified signal with a second gain, and outputs the a second amplified signal. The power amplifier device has a filter that filters the second amplified signal by performing low-pass filtering or band-pass filtering, and outputs a filtered signal. The power amplifier device has an amplitude comparator that compares an amplitude of a first comparison signal generated from the RF input signal with an amplitude of a second comparison signal generated from the filtered signal, and it outputs an amplitude comparison signal on the basis of the comparison result.

In accordance with the amplitude comparison signal, the second power amplifier adjusts the second gain so that the first amplitude and the second amplitude are equal to each other.

In the following, embodiments will be explained with reference to the figures.

Embodiment 1

Figure 1:
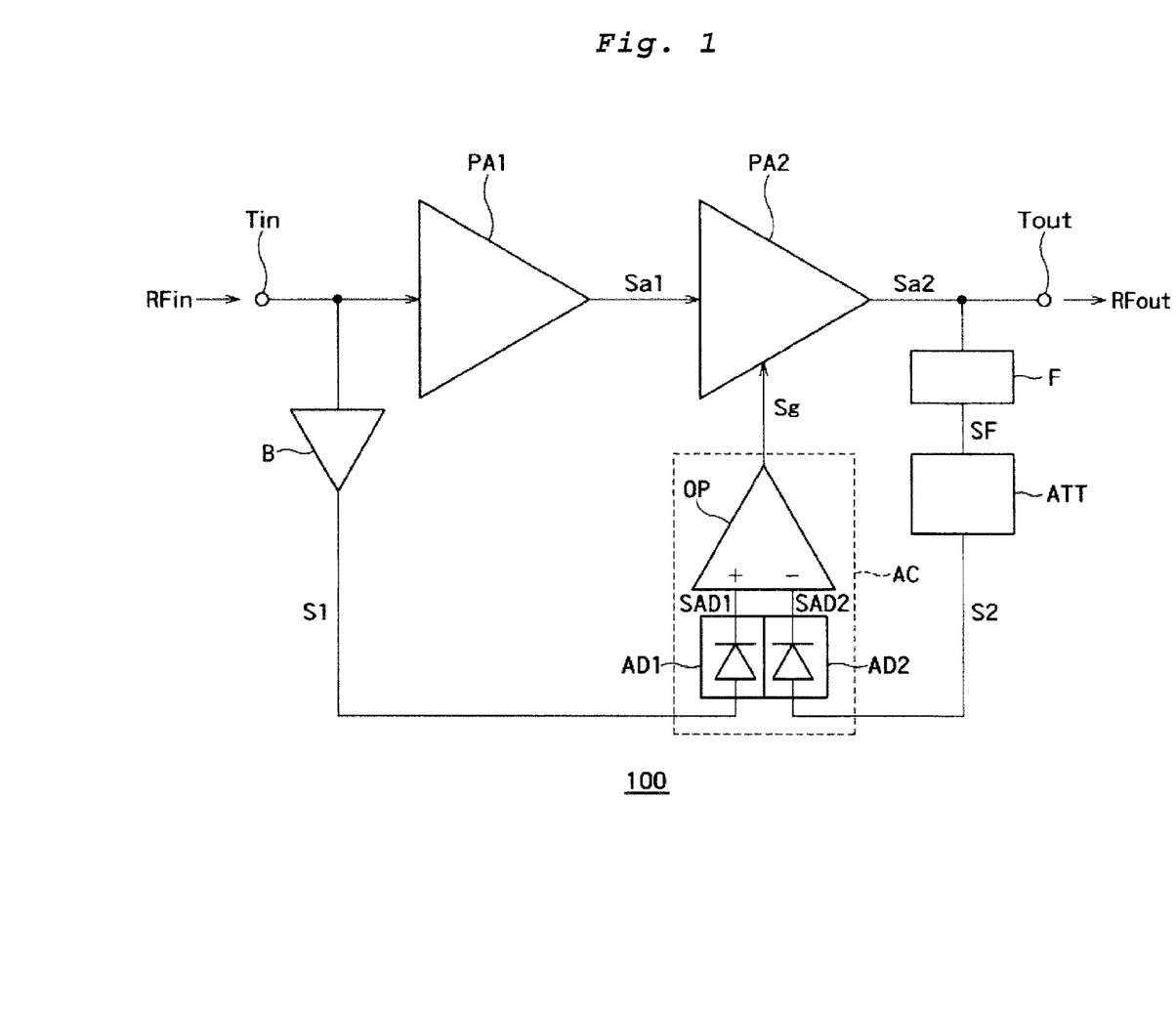
FIG. 1 is a diagram illustrating an example configuration of a power amplifier device according to a first embodiment.

FIG. 1 is a diagram illustrating a configuration of a power amplifier device according to Embodiment 1.

As shown in FIG. 1, a power amplifier device 100 has an input terminal Tin, an output terminal Tout, a first power amplifier PA1, a second power amplifier PA2, a filter F, an amplitude comparator AC, an attenuator ATT, and a buffer B. The input terminal Tin has an RF input signal RFin input thereto. The output terminal Tout outputs an RF output signal RFout therefrom.

The first power amplifier PA1 has its input connected to the input terminal Tin. This first power amplifier PA1 amplifies the amplitude of the RF input signal RFin that is input via the input terminal Tin with a first gain, and it outputs a first amplified signal Sa1.

The second power amplifier PA2 has its output connected to the output terminal Tout. The second power amplifier PA2 amplifies the first amplified signal Sa1 with a second gain, and it outputs the second amplified signal Sa2.

In the example shown in FIG. 1, the output of the first power amplifier PA1 is connected to the input of the second power amplifier PA2. The second power amplifier PA2 has the first amplified signal Sa1 input thereto, amplifies the first amplified signal Sa1, and outputs the second amplified signal Sa2.

One or a plurality of other power amplifiers may be arranged between the output of the first power amplifier PA1 and the input of the second power amplifier PA2. In that case, the first amplified signal Sa1 is amplified by one or a plurality of other power amplifiers, and the signal amplified by the last of the other power amplifiers is input to the second power amplifier PA2.

A buffer B has its input connected to the input terminal Tin. The buffer B has the RF input signal RFin input thereto, amplifies the RF input signal RFin with the third gain, and outputs the obtained signal as the first comparison signal S1.

The first comparison signal S1 is generated by buffer B from the RF input signal RFin. However, the buffer B may also be omitted. In such a case, the RF input signal RFin is equivalent to the first comparison signal S1.

The filter F outputs the filtered signal SF obtained by low-pass filtering or band-pass filtering of the second amplified signal Sa2. For example, as shown in FIG. 1, the filter F is connected between the output terminal Tout and the input of the amplitude comparator AC. In this case, the RF output signal RFout is the second amplified signal Sa2.

The attenuator ATT has the filtered signal SF input thereto, attenuates the amplitude of the filtered signal SF, and outputs a second comparison signal S2. That is, the second comparison signal S2 is generated from the second amplified signal Sa2 passing through the filter F and the attenuator ATT. Here, the attenuator ATT may be omitted. In this case, the filtered signal SF is equivalent to the second comparison signal S2.

The amplitude comparator AC compares the first amplitude of the first comparison signal S1 generated from the RF input signal RFin with the second amplitude of the second comparison signal S2 generated from the filtered signal SF, and it outputs the amplitude comparison signal Sg on the basis of the comparison result.

In the example shown in FIG. 1, the amplitude comparator AC has the first amplitude-detecting circuit AD1, a second amplitude-detecting circuit AD2, and op-amp OP. The first amplitude-detecting circuit AD1 has its input connected to the output of the buffer B, and it has the first comparison signal S1 input thereto. Also, the first amplitude-detecting circuit AD1 has its output connected to the non-inverted input terminal of the op-amp OP. The first amplitude-detecting circuit AD1 detects the amplitude of the first comparison signal S1, and, corresponding to the detection result, it outputs the first amplitude detection signal SAD1. In one embodiment, the first amplitude detection signal SAD1 is a voltage corresponding to the amplitude of the first comparison signal S1.

Also, the second amplitude detecting circuit AD2 has its input connected to the output of the attenuator ATT, and has its output connected to the inverted input terminal of the op-amp OP. The second amplitude-detecting circuit AD2 detects the amplitude of the second comparison signal S2, and, corresponding to the detection result, it outputs the second amplitude detection signal SAD2. In one embodiment, the second amplitude detection signal SAD2 is the voltage corresponding to the amplitude of the second comparison signal S2.

Also, the op-amp OP compares the first amplitude detection signal SAD1 with the second amplitude detection signal SAD2, and it outputs the signal corresponding to the comparison result as the amplitude comparison signal Sg.

Then, corresponding to the amplitude comparison signal Sg output by the op-amp OP, the second power amplifier PA2 adjusts the second gain so that the first amplitude of the first comparison signal S1 is equal to the second amplitude of the second comparison signal S2.

As explained above, the power amplifier device 100 detects the amplitude of the input to the power amplifier circuit composed of two or more power amplifiers and the amplitude of the RF signal from the output of the power amplifier circuit that has been attenuated, and compares them with each other. The result is fed back to the last power amplifier. As a result, the gain of the power amplifier circuit can be controlled so that it corresponds to the attenuation rate of the attenuator.

That is, the power amplifier device 100 can generate an RF output signal that varies linearly with respect to the input of the RF input signal RFin. As a result, it is possible to decrease the distortion in the RF output signal RFout.

As explained above, with the power amplifier device of the present embodiment, it is possible to reduce the distortion in the RF output signal.

Figure 2:
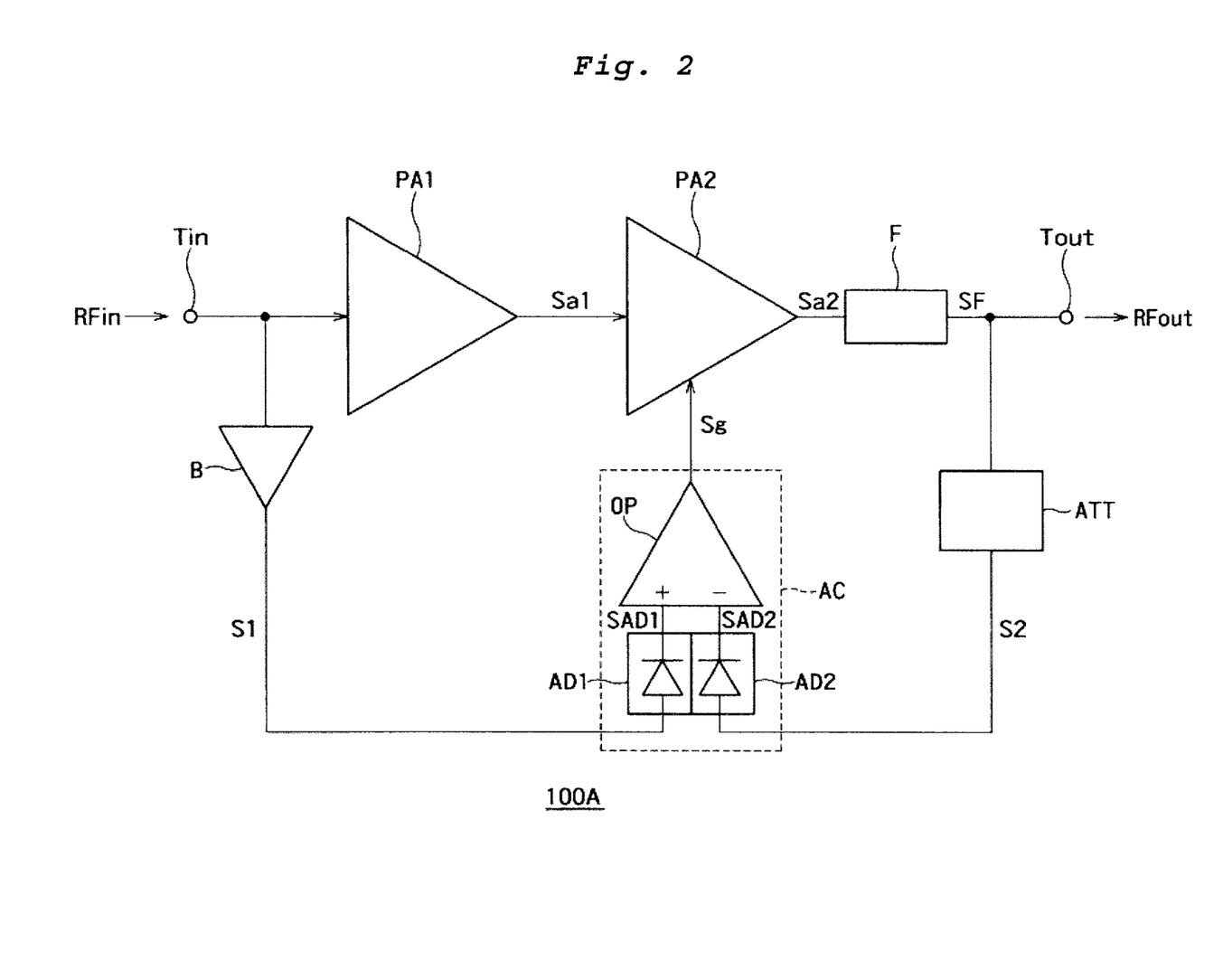
FIG. 2 is a diagram illustrating an example configuration of a power amplifier device according to a modified example of the first embodiment.

The position of the filter F may be different from that shown in the example in FIG. 1. FIG. 2 is a diagram illustrating a configuration of a power amplifier device 100A that is a modified example of Embodiment 1.

As shown in FIG. 2, the filter F may be connected between the output of the second power amplifier PA2 and the output terminal Tout. In this case, the RF output signal RFout is the filtered signal SF.

The remaining configuration and functions of the power amplifier device 100A are the same as those of the power amplifier device 100 shown in FIG. 1, and the same operation and effects can be realized.

In the embodiments presented below, as shown in FIG. 2, the filter F may also be connected between the output of the second power amplifier PA2 and the output terminal Tout.
Embodiment 2

Figure 3:
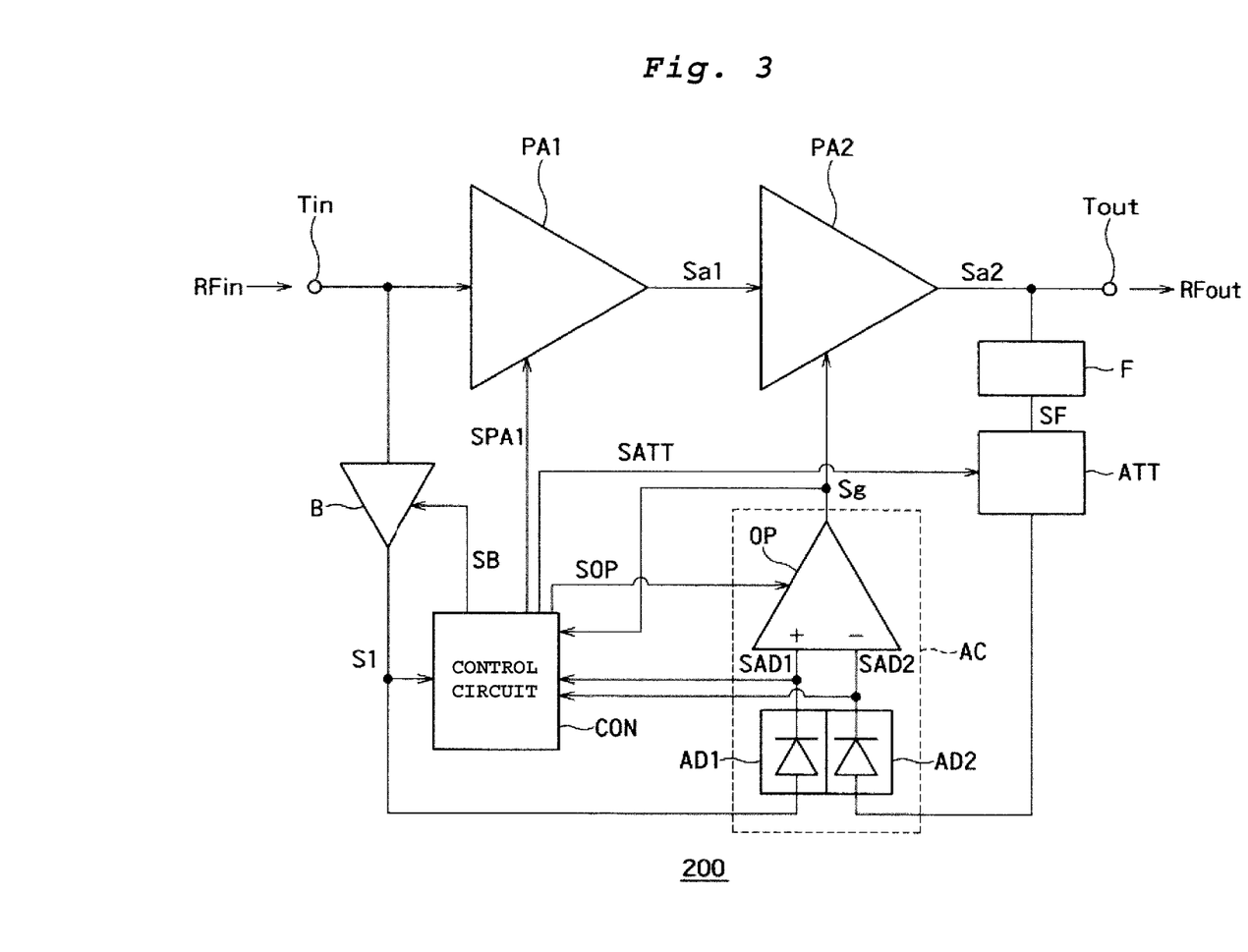
FIG. 3 is a diagram illustrating an example configuration of a power amplifier device according to a second embodiment.

FIG. 3 is a diagram illustrating a constitution of a power amplifier device according to Embodiment 2. The same reference numbers as those in FIG. 1 are used in FIG. 3 to identify elements that are the same as in Embodiment 1.

As shown in FIG. 3, a power amplifier device 200 differs from the power amplifier device 100 according to Embodiment 1 in that it also has a control circuit CON.

This control circuit CON has the amplitude comparison signal Sg, or the first amplitude detection signal SAD1 and the second amplitude detection signal SAD2 input thereto (that is, the control circuit CON can acquire the information related to the relationship in magnitude between the first amplitude of the first comparison signal S1 and the second amplitude of the second comparison signal S2).

The control circuit CON outputs control signals SB, SPAT, SATT, and SOP, and it adjusts at least one of the first gain of the first power amplifier PA1, the third gain of the buffer B, the gain of the amplitude comparator AC, and the attenuation rate of the attenuator ATT, respectively, so that the first amplitude of the first comparison signal S1 and the second amplitude of the second comparison signal S2 are equal to each other. For example, when the first amplitude is larger than the second amplitude, the control circuit CON decreases the first gain, or the third gain, or the gain of the amplitude comparator AC, or increases the attenuation rate. On the other hand, when the first amplitude is smaller than the second amplitude, the control circuit CON increases the first gain, or the third gain, or the gain of the amplitude comparator AC, or decreases the attenuation rate.

As a result, control is carried out so that the first amplitude of the first comparison signal S1 is equal to the second amplitude of the second comparison signal S2; and control is carried out so that the gain of the first power amplifier PA1 and the second power amplifier PA2 and the attenuation rate of the attenuator ATT are equal to each other. As a result, it is possible to reduce the distortion in the RF output signal RFout.

Also, the control circuit CON has the first comparison signal S1 input thereto. Then, when the first amplitude of the first comparison signal S1 is smaller than a preset threshold, the control circuit CON increases the first gain and/or increases the third gain.

When the amplitude of the RF input signal RFin is lower than a prescribed level, the power amplifier device 200 cannot correct the difference between the input and output sufficiently (that is, the loop gain is low). Here, when the amplitude of the RF input signal RFin is lower than a preset threshold, the control circuit CON performs a calibration so that the attenuation rate and the gain become equal to each other. As a result, it is possible to make appropriate correction for the difference between the input and the output.

The remaining features of the configuration and functions of the power amplifier device 200 are the same as those of the power amplifier device 100 in Embodiment 1.

As a result, in the power amplifier device according to this embodiment, just as in Embodiment 1, it is possible to reduce the distortion of the RF output signal.
Embodiment 3

Preferably, it is necessary to linearize separately for the distortion of the phase of the RE output signal in addition to reducing the distortion in the amplitude of the RF output signal. In this embodiment, an example configuration for reducing the distortion in the phase of the RF output signal will be explained.

Figure 4:
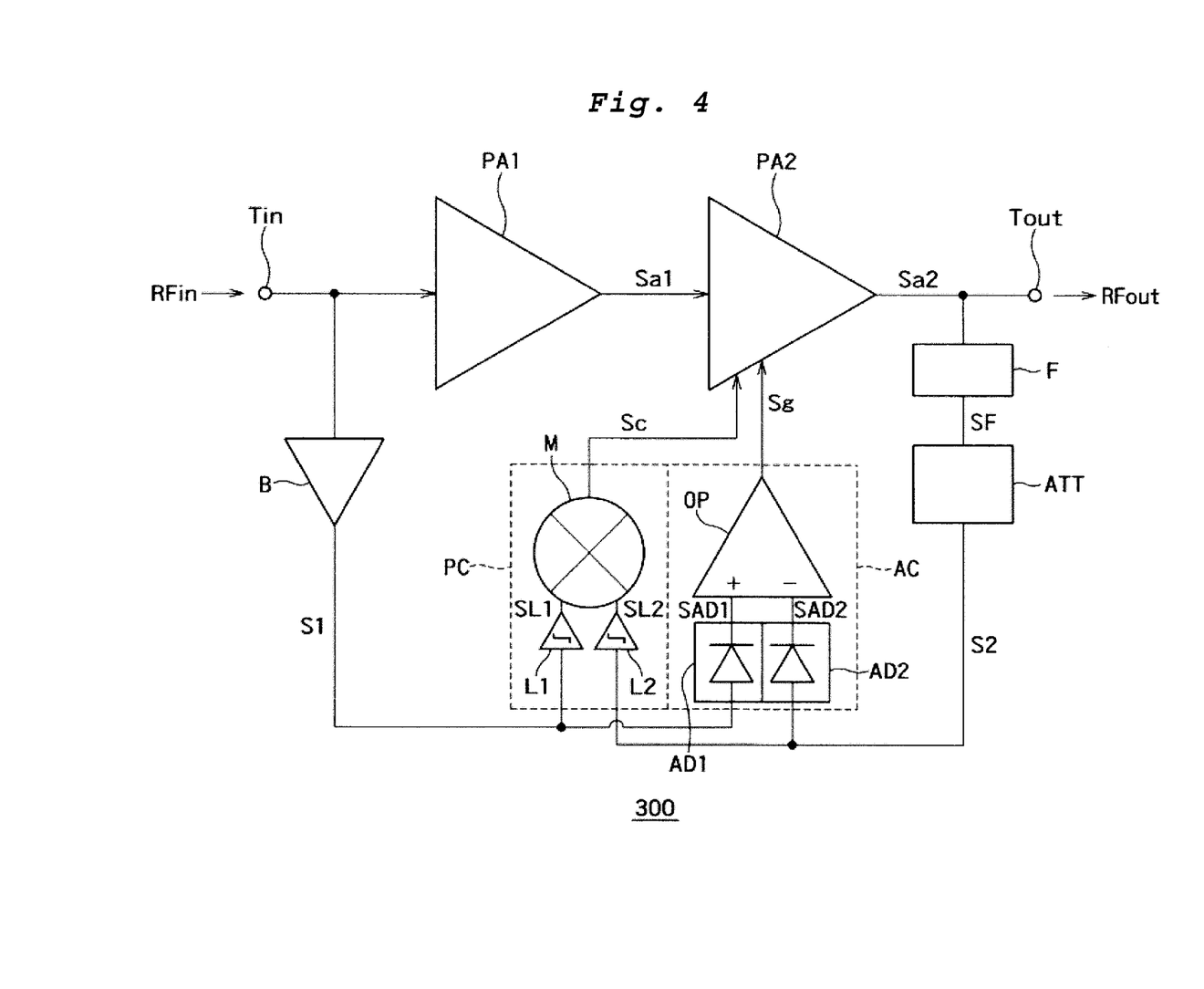
FIG. 4 is a diagram illustrating an example configuration of a power amplifier device according to a third embodiment.

FIG. 4 is a diagram illustrating a configuration of a power amplifier device according to Embodiment 3. In FIG. 4, the same reference numbers as those in in FIG. 1 above are use to identify elements that are the same as in Embodiment 1.

As shown in FIG. 4, a power amplifier device 300 differs from the power amplifier device 100 in Embodiment 1 in that it also has a phase comparator PC. The phase comparator PC compares the first phase of the first comparison signal S1 and the second phase of the second comparison signal S2, and, on the basis of the comparison result, outputs the phase comparison signal Sc. As a result, the phase comparison signal Sc contains the information related to the first phase of the first comparison signal S1 and the second phase of the second comparison signal S2.

In the example shown in FIG. 4, the phase comparator PC has a first limiter circuit L1, a second limiter circuit L2, and a mixer circuit M.

The first limiter circuit L1 has the first comparison signal S1 input thereto. This first limiter circuit L1 outputs a first limit signal SL1 obtained by limiting the amplitude of the first comparison signal S1 to a preset value. The second limiter circuit L2 has the second comparison signal S2 input thereto, and outputs a second limit signal SL2 obtained by limiting the amplitude of the second comparison signal S2 to the preset value. The mixer circuit M mixes the first limit signal and the second limit signal, and outputs the mixed signal as a phase comparison signal Sc.

Here, corresponding to the phase comparison signal Sc, the second power amplifier PA2 adjusts the phase difference between the signal based on the first amplitude signal Sa1 (here, the first amplified signal Sa1) and the second amplified signal Sa2 so that the phase difference between the first comparison signal S1 and the second comparison signal S2 is equal to a preset target value.

Figure 5:
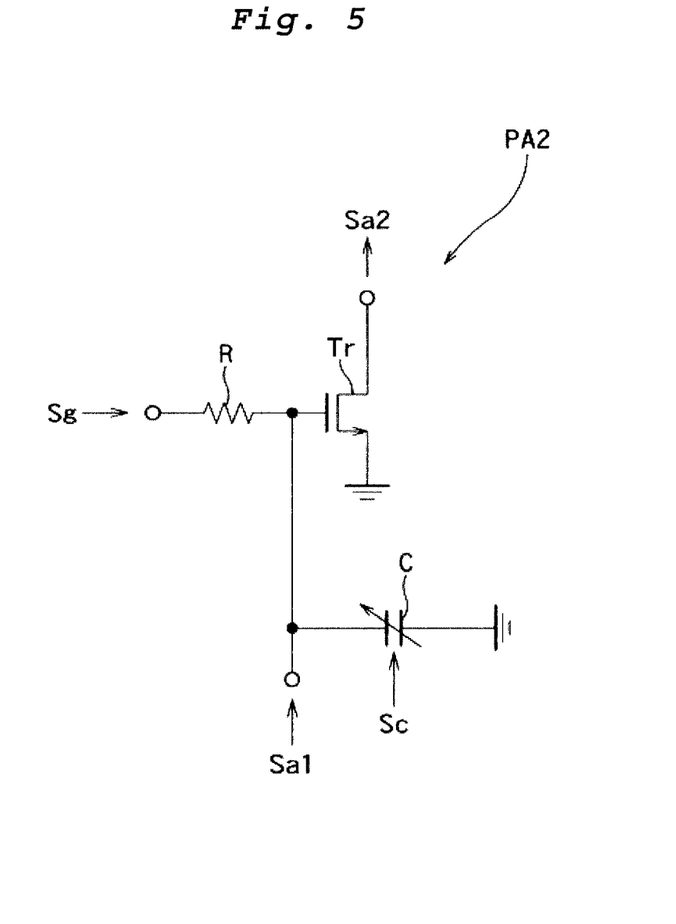
FIG. 5 is a diagram illustrating an example configuration of a power amplifier device according to a fourth embodiment.

FIG. 5 is a circuit diagram illustrating the configuration of the second power amplifier PA2 shown in FIG. 4. As shown in FIG. 5, the second power amplifier PA2 has a variable capacitor C, a resistor R and an nMOS transistor Tr. The variable capacitor C has a signal based on the first amplified signal Sa1 (here, the first amplified signal Sa1) input to one terminal, and has the other terminal connected to ground. Here, the capacitance value of the variable capacitor C is controlled by using the phase comparison signal Sc.

The resistor R has the amplitude comparison signal Sg input to one terminal, and its other terminal is connected to one terminal of the variable capacitor C.

The nMOS transistor Tr has its source connected to the ground, and has its gate connected to the other terminal of the resistor R. The nMOS transistor Tr outputs the second amplified signal Sa2 from its drain.

By using the phase comparison signal Sc, control is carried out so that the capacitance of the variable capacitor C increases; and control is carried out so that the phase of the second amplified signal Sa2 becomes delayed relative to the phase of the first amplified signal Sa1. On the other hand, control is carried out according to the phase comparison signal Sc so that the capacitance of the variable capacitor C becomes smaller; and control is carried out so that the phase of the second amplified signal Sa2 becomes advanced with respect to the phase of the first amplified signal Sa1.

In this way, it is possible to control the phase of the second power amplifier PA2 by the variable capacitor (varactor).

As explained above, it is preferable that the phase be also linearized separately in addition to the amplitude.

Here, just as the amplitude, the input phase and output phase are compared with each other, and the phase of the power amplifier of the last section is adjusted so that their phases become equal to each other (i.e., the difference between them becomes zero). In phase detection, the amplitude is kept constant by the limiter, and it is possible to compare the phases by the mixer circuit. As the phase is controlled as a result of the comparison, it is possible to have a constant phase difference.

Usually, it is difficult to accurately detect the phase (phase difference) of signals with different amplitudes because the output phase of the circuit itself depends on the amplitude. However, for the power amplifier device 300, control is carried out so that the amplitude of the first comparison signal S1 and the amplitude of the second comparison signal S2 become equal to each other.

As a result, the first comparison signal S1 and second comparison signal S2, controlled to have the same amplitude, are input to the first limiter circuit L1 and second limiter circuit L2, respectively. Consequently, even when the ability of the first limiter circuit L1 and second limiter circuit L2 is low, it is still possible to accurately detect their phases (that is, their phase difference).

The other features of the constitution and functions of the power amplifier device 300 are the same as those of the power amplifier device 100 of Embodiment 1.

That is, in the power amplifier device according Embodiment 3, just as with Embodiment 1, it is possible to reduce the distortion of the RF output signal.

Embodiment 4

The following section explains an example configuration for adjusting the offset and/or polarity of the mixer circuit according to Embodiment 4.

Figure 6:
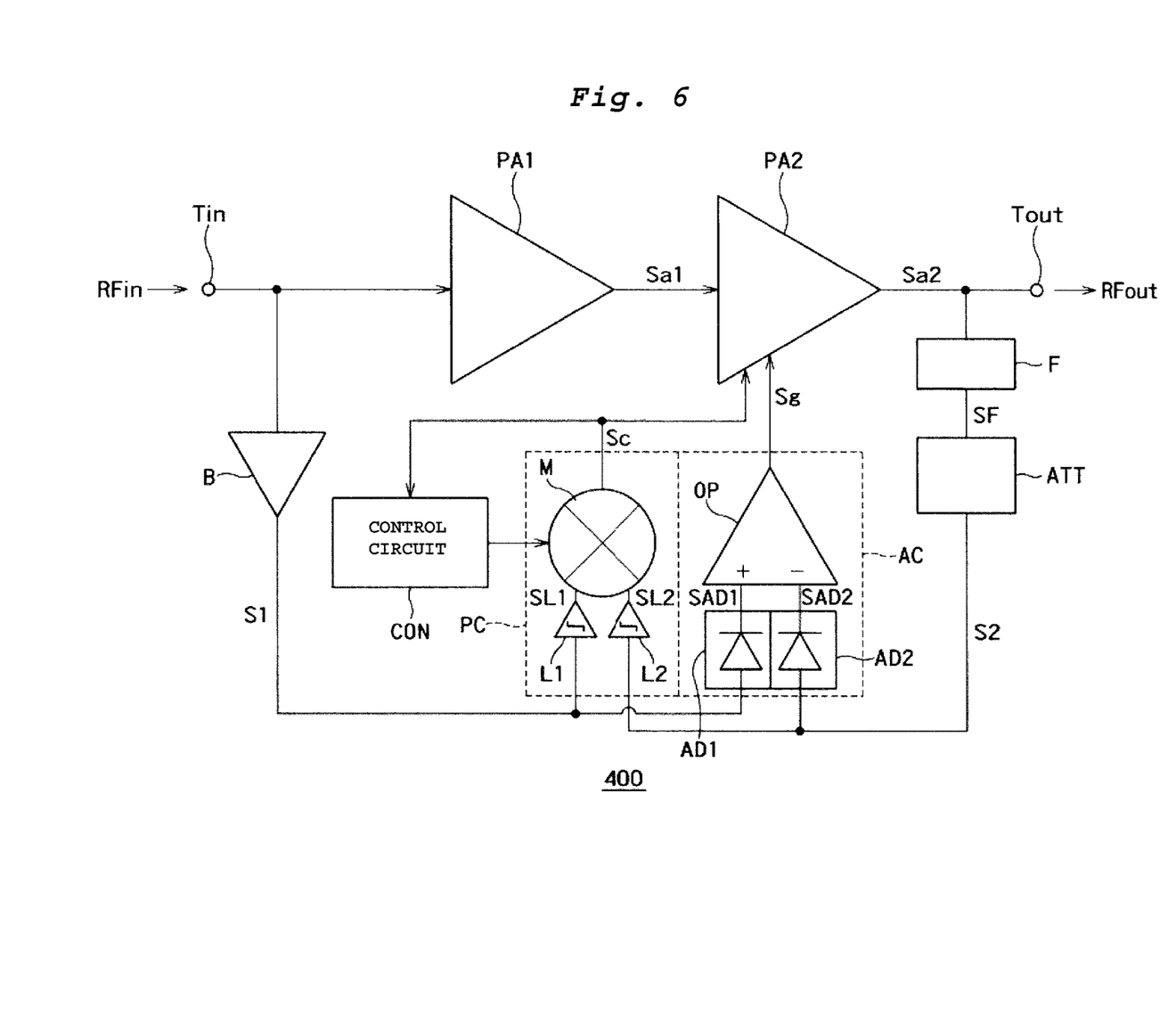
FIG. 6 is a circuit diagram illustrating an example configuration of a power amplifier shown in FIG. 5.

FIG. 6 is a diagram illustrating an example of the constitution of the power amplifier device 400 according to Embodiment 4. In FIG. 6, the same reference numbers as those in FIG. 4 above are used to identify elements that are the same in Embodiment 3. In FIG. 6, the configuration wherein the control circuit CON controls the phase comparator PC is described. In addition, as shown in FIG. 6, in the configuration of the control circuit CON, the portions thereof that are the same as those shown in FIG. 4 will not be explained again. That is, in addition to the configuration shown in FIG. 6, the control circuit CON in Embodiment 4 also has the configuration and functions explained with reference to Embodiment 3.

As shown in FIG. 6, the power amplifier device 400 also has a control circuit CON, just as that in the power amplifier device 300 in Embodiment 3.

This control circuit CON adjusts the offset and/or polarity of the mixer circuit M corresponding to the phase comparison signal Sc. For example, in the mixer circuit M, the phase difference between the first comparison signal 51 and the second comparison signal S2 may not necessarily be $\pi/2$. In such a case, the output of the mixer circuit M always has an offset present therein. In addition, depending on which of the phase of the first comparison signal S1 and the phase of the second comparison signal S2 is advanced, it is necessary to change the control direction.

Here, the control circuit CON controls the polarity and/or offset so that the phase comparison signal Sc, which is the output of the mixer circuit, becomes an appropriate voltage. As a result, the phase comparator PC can output a more appropriate phase comparison signal Sc. That is, the second power amplifier PA2 can control the phase more appropriately on the basis of the phase comparison signal Sc.

Also, the remaining features and functions of the power amplifier device 400 are the same as those of the power amplifier device 300 in Embodiment 3.

As a result, according to the power amplifier device according to Embodiment 4, just as in Embodiment 3, it is also possible to reduce the distortion in the RF output signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A power amplifier device comprising:
   a first power amplifier that is configured to amplify an amplitude of an RF input signal with a first gain and to output a first amplified signal;
   a second power amplifier that is configured to amplify the first amplified signal with a second gain and to output a second amplified signal;
   a filter that is configured to filter the second amplified signal and to output the filtered second amplified signal;
   a buffer that is configured to amplify the RF input signal with a third gain and to output the amplified RF input signal as a first comparison signal;
   an attenuator that is configured to attenuate the filtered second amplified signal and output the attenuated filtered second amplified signal as a second comparison signal;
   an amplitude comparator that is configured to compare an amplitude of the first comparison signal with an amplitude of the second comparison signal, and to output an amplitude comparison signal based on the comparison result; and
   a control circuit configured to adjust one of the first gain of the first power amplifier, the third gain of the buffer, a gain of the amplitude comparator, and an attenuation rate of the attenuator, so as to make the amplitudes of the first and second comparison signals more equal to each other, such that if the amplitude of the first comparison signal is larger than the amplitude of the second comparison signal, the first gain is decreased or the attenuation rate is increased, or if the amplitude of the first comparison signal is smaller than the amplitude of the second comparison signal, the first gain is increased or the attenuation rate is decreased, wherein
   the second power amplifier is configured to adjust the second gain based on the amplitude comparison signal so as to make the amplitudes of the first and second comparison signals more equal to each other.

2. The power amplifier device according to claim 1, wherein the filter is connected between an output terminal and the attenuator, and
   the second amplified signal is output through the output terminal.

3. The power amplifier device according to claim 1, wherein
   the filter is connected between the second power amplifier and an output terminal, and
   the filtered signal is output through the output terminal.

4. The power amplifier device according to claim 1, wherein
   if the amplitude of the first comparison signal is smaller than a preset threshold, the first gain is increased or the third gain is increased.

5. A power amplifier device comprising:
   a first power amplifier that is configured to amplify an amplitude of an RF input signal with a first gain and to output a first amplified signal;
   a second power amplifier that is configured to amplify the first amplified signal with a second gain and to output a second amplified signal;
   a filter that is configured to filter the second amplified signal and to output the filtered second amplified signal;
   an amplitude comparator that is configured to compare an amplitude of a first comparison signal generated from the RF input signal with an amplitude of a second comparison signal generated from the filtered second amplified signal, and to output an amplitude comparison signal based on the comparison result; and
   a phase comparator that is configured to compare a phase of the first comparison signal and a phase of the second comparison signal, and to output a phase comparison signal based on the comparison result, the phase comparator including a first limiter circuit that is configured to limit the amplitude of the first comparison signal to a preset value to produce a first limit signal, a second limiter circuit that is configured to limit the amplitude of the second comparison signal to the preset value to produce a second limit signal, and a mixer circuit that is configured to mix the first limit signal and the second limit signal and to output the mixed signal as the phase comparison signal, wherein:
   the second power amplifier is configured to adjust the second gain based on the amplitude comparison signal so as to make the amplitudes of the first and second comparison signals more equal to each other; and
   the second power amplifier is configured to adjust a phase difference between the first amplified signal and the second amplified signal based on the phase comparison signal so as to make a phase difference between the first comparison signal and the second comparison signal approach a preset target value.

6. The power amplifier device according to claim 5, further comprising:
   a control circuit that is configured to adjust an offset or polarity of the mixer circuit according to the phase comparison signal.

7. A power amplifier device comprising:
   a first power amplifier that is configured to amplify an amplitude of an RF input signal with a first gain, and to output a first amplified signal;
   a second power that is configured to amplify the first amplified signal with a second gain, and to output a second amplified signal;
   a filter that is configured to filter the second amplified signal, and output the filtered second amplified signal; and
   an amplitude comparator that is configured to compare an amplitude of a first comparison signal generated from the RF input signal with an amplitude of a second comparison signal generated from the filtered second amplified signal, and to output an amplitude comparison signal on the basis of the comparison result, wherein:
   the second power amplifier is configured to adjust the second gain based on the amplitude comparison signal so as to make the amplitudes of the first and second comparison signals more equal to each other; and
   the second power amplifier comprises:
   a variable capacitor having one terminal to which a signal based on the first amplified signal is input and another terminal connected to ground, and having a capacitance value controlled according to the phase comparison signal;
   a resistor having one terminal to which the amplitude comparison signal is input and another terminal connected to said one terminal of the variable capacitor; and
   an nMOS transistor having a source connected to the ground, a gate connected to said another terminal of the resistor, and a drain which outputs the second amplified signal.

8. A power amplifier device comprising:
   a first power amplifier that is configured to amplify an amplitude of an RF input signal with a first gain, and to output a first amplified signal;

a second power amplifier that is configured to amplify the first amplified signal with a second gain, and to output a second amplified signal;

a filter that is configured to filter the second amplified signal, and output the filtered second amplified signal; and a phase comparator that is configured to compare a phase of a first comparison signal and a phase of a second comparison signal and output a phase comparison signal on the basis of the comparison result, wherein:

the second power amplifier is configured to adjust a phase difference between the first amplified signal and the second amplified signal based on the phase comparison signal so as to make a phase difference between the first comparison signal and the second comparison signal approach a preset target value; and the phase comparator comprises:

a first limiter circuit that is configured to limit the amplitude of the first comparison signal to a preset value to produce a first limit signal;

a second limiter circuit that is configured to limit the amplitude of the second comparison signal to the preset value to produce a second limit signal; and a mixer circuit that is configured to mix the first limit signal and the second limit signal, and output the mixed signal as the phase comparison signal.

9. The power amplifier device according to claim 8, further comprising:

a control circuit that is configured to adjust an offset or polarity of the mixer circuit according to the phase comparison signal.

* * * * *